United States Patent [19]

Ying

[11] Patent Number: 5,285,102
[45] Date of Patent: Feb. 8, 1994

[54] METHOD OF FORMING A PLANARIZED INSULATION LAYER

[75] Inventor: Peter S. Ying, Plano, Tex.

[73] Assignee: Texas Instruments Incorporated, Dallas, Tex.

[21] Appl. No.: 988,386

[22] Filed: Dec. 8, 1992

Related U.S. Application Data

[63] Continuation of Ser. No. 735,504, Jul. 25, 1991, abandoned.

[51] Int. Cl.⁵ .................. H01L 29/34; H01L 29/04
[52] U.S. Cl. .................................. 257/638; 257/637; 257/641; 257/647
[58] Field of Search ................. 357/54, 59; 257/635, 257/637, 638, 640, 641, 644, 647, 649, 650

[56] References Cited

U.S. PATENT DOCUMENTS

| | | | |
|---|---|---|---|
| 4,239,559 | 12/1980 | Ito | 357/24 |
| 4,982,250 | 1/1991 | Manos, II et al. | 357/54 |
| 5,006,913 | 4/1991 | Sugahara et al. | 357/4 |
| 5,068,711 | 11/1991 | Mise | 357/54 |

OTHER PUBLICATIONS

B. E. Deal, "Historical Perspectives of Silicon Oxidation" in *The Physics and Chemistry of SiO₂ and the Si-SiO₂ Interface*, Edited by C. Robert Helms and B. E. Deal, pp. 5-15 (1988).

Sze, S. M., *Semiconductor Devices Physics and Technology*, 1985, pp. 341-354.

*Primary Examiner*—J. Carroll
*Attorney, Agent, or Firm*—Jacqueline J. Garner; William E. Hiller; Richard L. Donaldson

[57] ABSTRACT

A method for forming a planar insulating layer over the surface of a semiconductor workpiece 8 which includes at least one low region 13 is discussed herein. The first step is to form a layer of blocking material 14 on the surface of the workpiece 8. A first material region 20 is then formed in the low region 13 and an insulating layer 21 is formed over the surface of the workpiece 8 including the first material region 20. The workpiece 8 is then heated in the presence of an active ambient such that the insulation layer 21 reflows and also so that the first material 20 region reacts with the active ambient to create an internal stress in said insulation layer 21. Other systems and methods are also disclosed.

14 Claims, 3 Drawing Sheets

5,285,102

METHOD OF FORMING A PLANARIZED INSULATION LAYER

This application is a continuation of application Ser. No. 07/735,504, filed Jul. 25, 1991 abandoned.

NOTICE (C) Copyright, *M* Texas Instruments Incorporated 1991. A portion of the disclosure of this patent document contains material which is subject to copyright and mask work protection. The copyright and mask work owner has no objection to the facsimile reproduction by anyone of the patent document or the patent disclosure, as it appears in the Patent and Trademark Office patent file or records, but otherwise reserves all copyright and mask work rights whatsoever.

FIELD OF THE INVENTION

This invention generally relates to the fabrication of semiconductor devices and specifically to a method of forming a planarized insulation region.

BACKGROUND OF THE INVENTION

As the device densities of integrated circuits continue to increase, the metallurgy technologies utilized to interconnect individual devices must meet more stringent requirements. For one, higher device counts necessitate multiple levels of metal. As the number of metal levels increases, it is important that the insulator layer separating these metal layers be as planar as possible. If planarity is not maintained, the resulting severe topologies may cause metal opens or shorts. As a result a method to create a planar layer is currently desirable.

Another application where planarization is required is in trench isolated semiconductor devices. Trench isolation is a way of providing interdevice isolation. Trench isolation is applicable to both bipolar and field effect transistor technologies. Traditionally, trench isolation involves etching a narrow, deep trench or groove in a silicon substrate and then filling the trench with a filler material. Trenches are also often used in memory design to provide information storage capacity which requires good electrical connection to selected transistors. Existing trench isolation techniques, however, do not permit wide variations in the dimensions of the trench. For example, if a wafer contains both large and small trenches and the material is deposited so that it fills the trenches, the large trenches will not be completely filled. Furthermore, trenches formed by traditional techniques have upper surfaces which are difficult to planarize. Consequently, most designers who employ trenches are forced to use them in narrow interdevice regions and use conventional thermally grown field oxides in the wider interdevice regions.

A common insulating material used between metal levels, to fill isolation trenches, and as a conformal layer, is borophosphosilicate glass (BPSG). The BPSG layer is typically deposited conformally and therefore maintains the topography of the underlying substrate. The glass layer can then be reflowed to create a more planar level or layer. The prior art reflow methods, however, do not create levels as planar as desired.

Another problem exists with the high temperatures which are required to reflow the glass layers. Typically temperatures of 900 degrees C. or more are necessary. These high temperatures cause degradation of the underlying semiconductor device due to migration of dopant materials. In addition, the reflow temperatures are higher than those applicable to the commonly used aluminum. If the temperatures are lowered it is very difficult to reflow the BPSG over severe topographies.

Other known techniques, such as the planarization from spin-on glass and resist etchback, are not desirable from a reliability standpoint. This is because an active gas may remain in the glass layer creating chemical and physical instability in the film.

Accordingly, improvements which overcome any or all of the problems are presently desirable.

SUMMARY OF THE INVENTION

Other objects and advantages will be obvious, and will in part appear hereinafter and will be accomplished by the present invention which provides a method for forming a planarized insulation layer.

A method for forming a planar insulating layer over the surface of a semiconductor workpiece which includes at least one low region is discussed herein. The first step is to form a layer of blocking material on the surface of the workpiece. A first material region is then formed in the low region and an insulating layer is formed over the surface of the workpiece including the first material region. The workpiece is then heated in the presence of an active ambient such that the insulation layer reflows and also so that the first material region reacts with the active ambient to create an internal stress in said insulation layer.

In a preferred embodiment, the blocking layer is a nitride layer, the insulating layer is formed from borophosphosilicate glass (BPSG), and the first material is polysilicon. The workpiece is heated in a steam ambient to reflow the BPSG layer and form silicon dioxide from the polysilicon and the steam. Other embodiments are also disclosed.

An advantage of the invention is that it is performed at relatively low temperatures, typically between 700 and 800 degrees C. This is an advantage over prior art methods which reflow glass at higher temperatures. The lower temperatures help to minimize the chance for damaging the semiconductor device below. Another advantage is that the process of the present invention may be performed at atmospheric pressure and therefore additional pressure capabilities are not necessary.

A still further advantage is in trench isolation applications. Here, trenches of varying sizes may be filled to substantially same levels. This characteristic is necessary to maintain a uniform surface topology.

BRIEF DESCRIPTION OF THE DRAWINGS

The above features of the present invention will be more clearly understood from consideration of the following descriptions in connection with accompanying drawings in which.

Corresponding numerals and symbols in the different figures refer to corresponding parts unless otherwise indicated.

DETAILED DESCRIPTION OF PREFERRED EMBODIMENTS

The making and use of the presently preferred embodiments are discussed below in detail. However, it should be appreciated that the present invention provides many applicable inventive concepts which can be embodied in a wide variety of specific contexts. The specific embodiments discussed are merely illustrative of specific ways to make and use the invention, and do not delimit the scope of the invention.

Figure 1A:
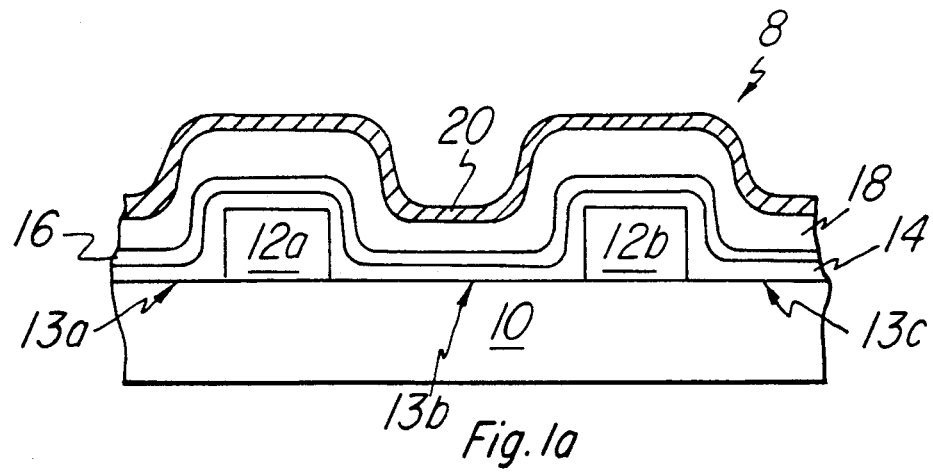
FIGS. 1a-1c are cross sectional views of the steps of a preferred embodiment process.

Referring first to FIG. 1a, a semiconductor workpiece 8 is shown which includes substrate 10 and two stacked regions 12a and 12b. The regions between the stacked regions 12 are referred to as low regions 13. The substrate 10 may typically be silicon for example. The regions 12a and 12b are shown solely as illustrative and may be any topography and may vary in height and width. For example, the stack may include multiple levels of insulators such as oxide or nitride, and conductors such as doped polysilicon or metal, as examples. The workpiece 8 may be any of the vast number of electronic devices known, utilizing technologies such as MOS, including CMOS, bipolar or BiCMOS, as examples. The present invention is applicable to any electronic device in which it is desired to have a planar insulative material overlie a workpiece 8.

The first step of the present invention is to deposit a first insulative layer 14 over the surface of workpiece 8. The purpose of the first insulative layer 14 is to prevent the active ambient which will be applied in later steps from deteriorating the electronic device below. In the first preferred embodiment, the semiconductor substrate 10 comprises silicon and the first insulative layer 14 comprises a nitride such as silicon nitride. The nitride layer 14 may typically be about 300 Angstroms thick and may be deposited by well known techniques.

Another insulating layer 16 is formed over insulating layer 14. In the preferred embodiment, the layer 16 may comprise an oxide layer deposited by the paralysis and decomposition of tetraethooxysilane (TEOS). Methods for depositing a TEOS layer are well known to those skilled in the art. In the first preferred embodiment, the TEOS layer 16 is typically about 1000 angstroms thick. The layer 16 is formed to block impurity diffusion into the device.

Next an insulating layer 18 is formed over the layer 16. In the first preferred embodiment, the layer 18 comprises borophosphosilicate glass (BPSG) and is typically about 8000 Angstroms thick. The BPSG layer 18 may be deposited by well known techniques such as chemical vapor deposition (CVD), for example. In the first preferred embodiment the BPSG is formed from a composition which includes 4.4% boron and 5.6% phosphorus.

The next step in the process flow of the first preferred embodiment is to deposit polysilicon layer 20. The polysilicon layer 20 is typically either doped or undoped and is typically in the range of about 100 Å to 4000 Å thick but may be thicker as required by the application. Typically a layer of 2000–3000 Å is used. Once again, polysilicon deposition techniques are well known in the current art. Either polycrystalline or amorphous silicon may be used to form layer 20 in the preferred embodiment.

Figure 1B:
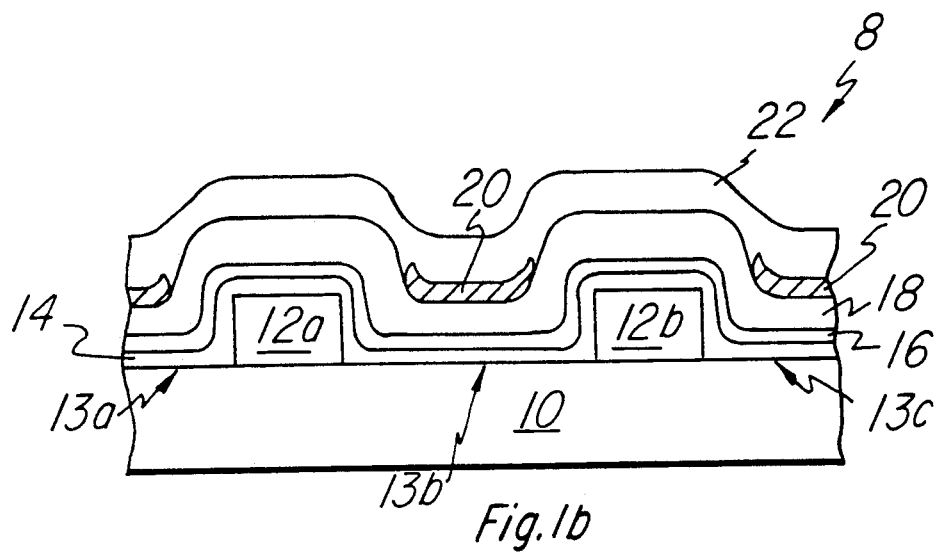

Referring next to FIG. 1b, polysilicon layer 20 is patterned and etched to remain in the low regions 13 between elevated regions 12. Photolithographic techniques to performs these processes are well known by those skilled in the art.

The next step in the flow is to deposit a second insulting material 22 on the surface of the workpiece 8. In the first preferred embodiment the layer 22 comprises BPSG and is typically about 3000 Å thick. The BPSG layer thickness may be varied as required. As illustrated, the materials are deposited conformally and maintain the topology of the original workpiece.

An anneal step may be performed subsequent to depositing the second layer of BPSG. In the first preferred embodiment, the anneal is performed at about 700 degrees C. for about 30 minutes in an argon or nitrogen atmosphere. The purpose of the anneal is to stabilize the film.

Figure 1C:
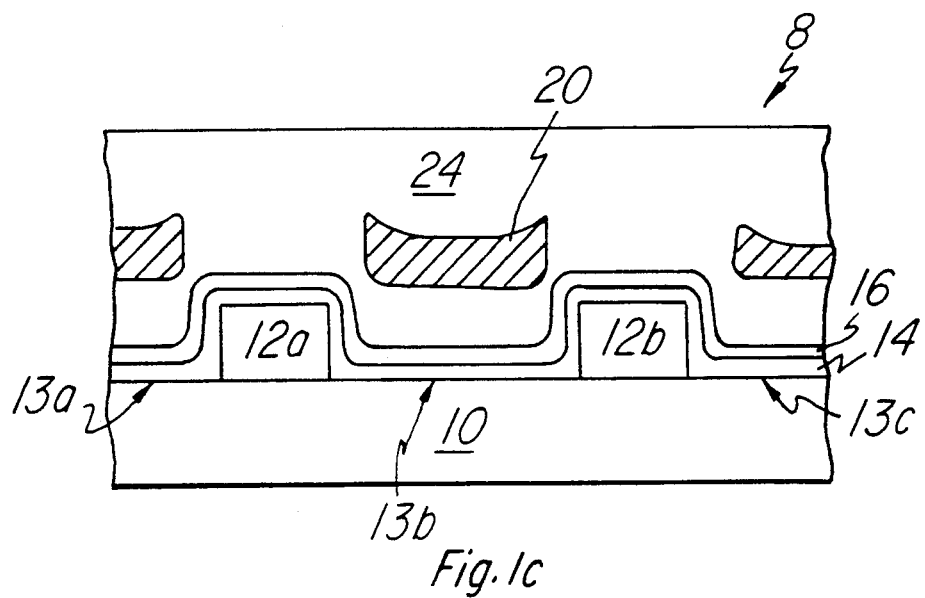

Referring now to FIG. 1c, to planarize the surface the insulating layers 18 and 22 are reflowed to form layer 24. The reflow is performed in the presence of an active ambient (not shown). The active ambient is chosen to react with the remaining portions of layer 20 and cause portions 20 to expand and in turn create an internal stress in the material layer 24. This internal stress aids in planarizing the top surface. The active ambient does not react with the active regions of the workpiece, however, because it is blocked by blocking layer 24 as discussed above. In the first preferred embodiment, the BPSG layers 18 and 22 are reflowed at between about 700 and 900 degrees C. in a steam ambient for approximately 5 to 120 minutes or with a rapid thermal anneal at about 900 to 1200 degrees C. for a few seconds. Polysilicon regions 20 react with the oxygen in a steam ambient to create silicon dioxide. As is known in the art, the volume of silicon dioxide is approximately twice that of polysilicon and as a result the desired internal stress is created. As an example, a 1000 Angstrom layer of polysilicon should be oxidized away in about 30 minutes in a 750 degree C. steam ambient.

The present invention is advantageous over the prior art because of the low reflow temperature. Since the reflow temperature is low, the probably of damaging the circuit beneath is minimized. Other methods of lowering the reflow temperature may be used in conjunction with this invention. Some of these methods are described in copending patent application Ser. No. 627,666, incorporated herein by reference.

An etchback step may be included subsequent to the reflow step. In the first preferred embodiment, the BPSG is etched back (e.g., 1000 Angstroms) for the purpose of gaining the desired thickness.

Many modifications and variations of the present invention should be obvious to those skilled in the art. For example, the thickness of the layers used may be varied. In addition, the materials may be varied. For example, arsenic glass, arsenic phosphorous boron glass or other glass films may be substituted for the BPSG film. In addition, a metal may be oxidized to create an internal stress. In general, a combination of any active ambient and material may be used where the active ambient increases the volume of the material when reacted with it.

Further, a blanket polysilicon following the topography will generate a stress in the vertical as well as the horizontal direction when it is oxidized. This stress will significantly increase the solubility of steam in the high stress area and therefore lower the reflow temperature.

Figure 2A:
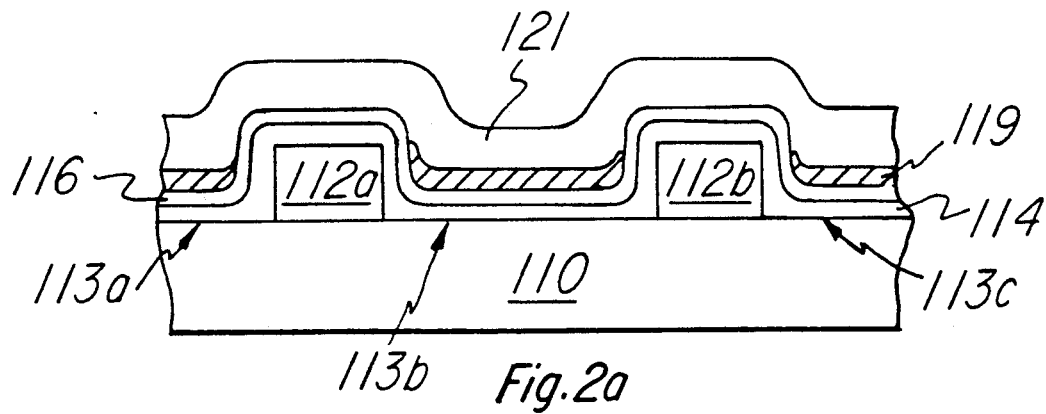
FIGS. 2a-2b are cross sectional views of the steps of an alternate preferred embodiment.

In addition, the order of the BPSG and polysilicon layers may be varied. As shown in FIG. 2a, polysilicon layer 119 is deposited directly on TEOS layer 116 and etched back to fill the low regions 113 between elevated regions 112. BPSG layer 121 is then deposited over the top of the surface. In this example, only one BPSG layer 121 is used.

Figure 2B:
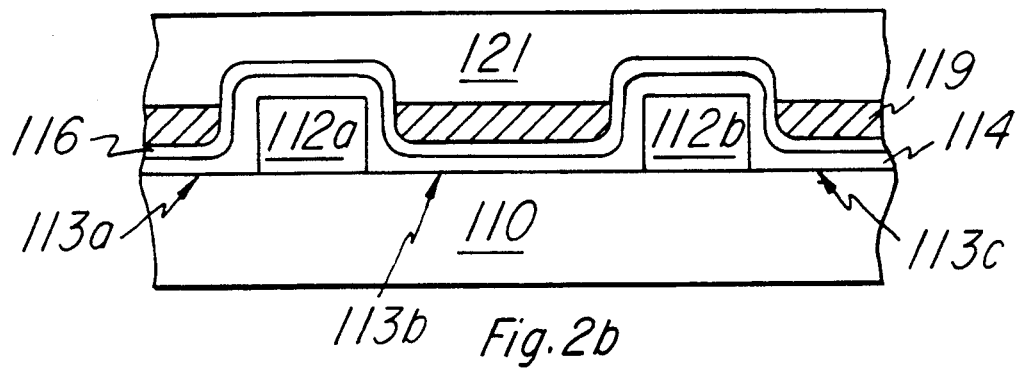

Referring now to FIG. 2b, the BPSG layer 121 is reflowed in the presence of an active ambient as discussed above. The layer 119 expands to create an internal stress which aids in planarizing the BPSG layer 121. Once again, this reflow may be performed at a low temperature.

In addition, other variations are possible. For example, layers of BPSG and polysilicon may be deposited. The number of depositions used is determined by design choice.

Figure 3:
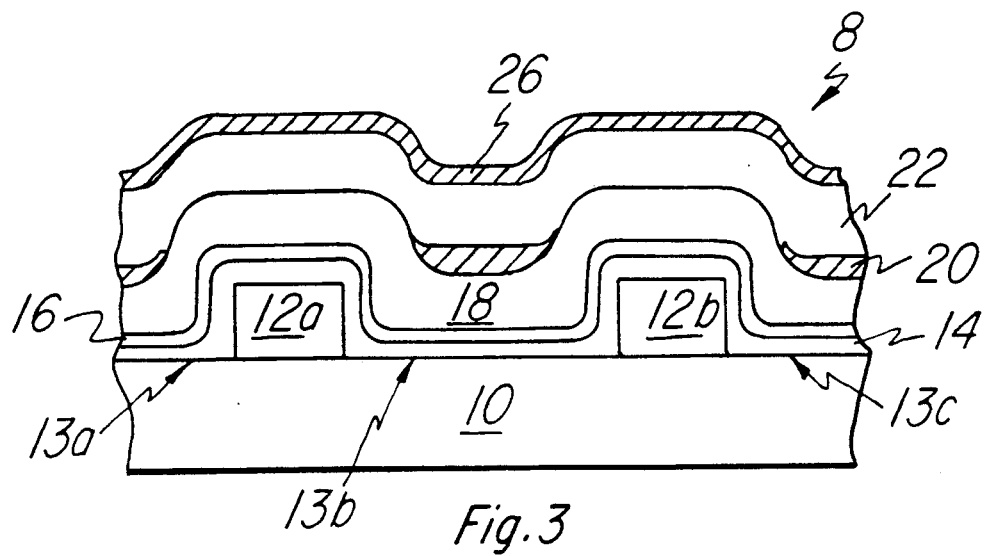
FIG. 3 is a cross sectional view of another embodiment.

An alternate embodiment, shown in FIG. 3, which illustrates the workpiece of FIG. 1b, includes implanting an impurity layer 26 into the insulation layer 22. In a preferred embodiment, this step includes implanting $8 \times 10^{15} m^{-3}$ of arsenic at 30 Kev, for example. The presence of the impurity layer will enhance the planarization during reflow.

In addition, the planarization may be enhanced by performing the reflow under an external pressure. For example, a pressure of between about 20 and 100 atm may be used.

Figure 4A:
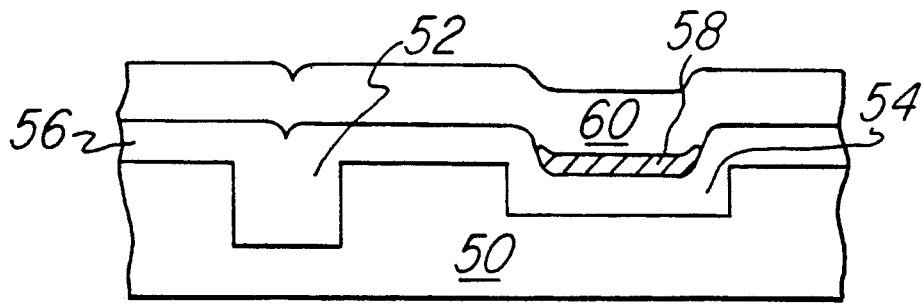
FIGS. 4a-4b are cross sectional views of a trench isolation embodiment.

An alternate embodiment of the present invention is illustrated in FIG. 4. Here a substrate 50 including the blocking layer as described above, includes trenches 52 and 54. Trench 52 and trench 54 are illustrative of the wide variation of trenches found in electronic devices. For the purpose of illustration, trench 52 is deeper and narrower than trench 54 and as a result will fill before trench 54 when a conformal deposition is made. In view of the discussion above with respect to FIGS. 1-3, the trench 54 may be thought of as a low region, such as low region 13 of FIG. 1. Naturally, the trench isolation may be on the same substrate as the stack configurations or other elevated topographies described with reference to FIG. 1 with no variation.

BPSG layer 56 is deposited on the surface of substrate 50 including trenches 52 and 54. Polysilicon region 58 is then formed in the trench 54 as described above and BPSG layer 60 is formed over the polysilicon region 58 and the BPSG layer 56.

Figure 4B:
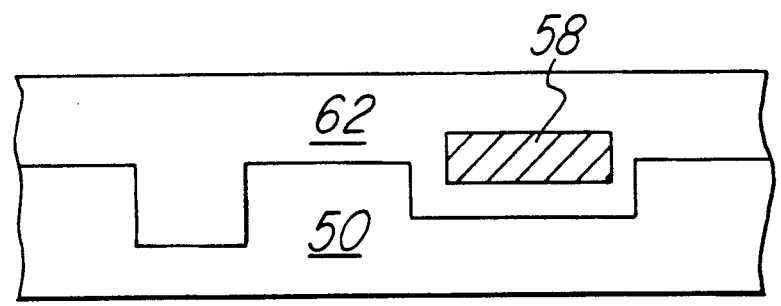

Referring now to FIG. 4b, the workpiece is heated to a temperature between about 700 and 1200 degrees C. in the presence of an active ambient and the BPSG layers 56 and 60 are reflowed to form planar layer 62. The polysilicon region is oxidized to create the desired internal stress. It is noted that the reflow temperature for trench isolation applications may be higher than other applications since this process is typically performed prior to forming doped regions and therefore it is not necessary to be concerned with impurity diffusion. Of course, lower temperatures may be used if necessary.

Many variations and modifications have been discussed herein with reference to FIGS. 1-4. Of course, these variations may be combined to achieve the desired final process.

The process and structure of the present invention may be used with a variety of process steps such as metal interlevel oxide (MILO) or metal level oxide (MLO) processes. Many devices such as dynamic random access memories (DRAM) or nonvolatile memories as examples may utilize this invention. In general, any integrated circuit which could use a low temperature dielectric for planarization would benefit from the method of the present invention.

The following is an example of a series of processes which may follow the processes described herein. As an example, the BPSG layer may be patterned and etched to create a 0.4 micron via that is 8000 Angstroms deep. This via may be filled by a chemical vapor deposited titanium nitride and tungsten (TiN/W) of 500 and 4000 Angstroms respectively. The TiN/W layer is etched back by 4000/500 Angstroms followed by deposition of titanium tungsten and aluminum silicon copper (TiW/Al-Si-Cu 0.5%) metal layers which are 500 and 6000 Angstroms thick respectively. This metal layer is then patterned and etched. Finally a protective overcoat may be deposited.

while this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A semiconductor device comprising:
   a semiconductor layer;
   a trench region formed in a surface of said semiconductor layer;
   an insulating layer formed on said surface of said semiconductor layer;
   a substantially planar borophosphosilicate glass (BPSG) layer formed over said insulating layer, said BPSG layer having a first material region formed within said BPSG layer, said first material region creating an internal stress within said in said BPSG layer to substantially planarize said BPSG layer.

2. The device of claim 1 wherein said semiconductor layer comprises a silicon layer.

3. The device of claim 2 wherein said insulating layer comprises a nitride layer.

4. The device of claim 1 wherein said first material region comprises a silicon dioxide region.

5. The device of claim 1 wherein said first material region is disposed in said trench.

6. A semiconductor device comprising:
   a semiconductor layer;
   at least two stacked layers formed on a surface of said semiconductor layer, said stacked layers separated by a low region;
   an insulating layer formed on said surface of said semiconductor layer;
   a substantially planar borophosphosilicate glass (BPSG) layer formed over said insulating layer, said BPSG layer having a first material region formed within said BPSG layer, said first material region creating an internal stress within said in said BPSG layer to substantially planarize said BPSG layer.

7. The device of claim 6 wherein said semiconductor layer comprises a silicon layer.

8. The device of claim 7 wherein said insulating layer comprises a nitride layer.

9. The device of claim 6 wherein said first material region comprises a silicon dioxide region.

10. A semiconductor device comprising:
    a semiconductor workpiece including at least two elevated regions separated by at least one low region disposed on a surface thereof;

an insulating layer formed on the surface of said workpiece;

a substantially planar borophosphosilicate glass (BPSG) layer formed over said insulating layer, said BPSG layer having a first material region formed within said BPSG layer, said first material creating an internal stress within said in said BPSG layer to substantially planarize said BPSG layer.

11. The device of claim 10 wherein said elevated regions comprise stack structures.

12. The device of claim 10 wherein said low region comprises a trench.

13. The device of claim 10 wherein said first material comprises silicon dioxide.

14. The device of claim 10 wherein said insulating layer comprises a nitride layer.

* * * * *